US009585260B2

(12) United States Patent
Lim et al.

(10) Patent No.: US 9,585,260 B2
(45) Date of Patent: Feb. 28, 2017

(54) ELECTRONIC COMPONENT MODULE AND MANUFACTURING METHOD THEREOF

(71) Applicant: SAMSUNG ELECTRO-MECHANICS CO., LTD., Suwon-Si, Gyeonggi-Do (KR)

(72) Inventors: Jae Hyun Lim, Suwon-Si (KR); Jong In Ryu, Suwon-Si (KR); Sun Ho Kim, Suwon-Si (KR); Eun Jung Jo, Suwon-Si (KR); Kyu Hwan Oh, Suwon-Si (KR); Do Jae Yoo, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 296 days.

(21) Appl. No.: 14/260,007

(22) Filed: Apr. 23, 2014

(65) Prior Publication Data
US 2015/0223361 A1    Aug. 6, 2015

(30) Foreign Application Priority Data
Feb. 6, 2014    (KR) .................. 10-2014-0013460

(51) Int. Cl.
*H05K 1/11*    (2006.01)
*H05K 3/34*    (2006.01)
(Continued)

(52) U.S. Cl.
CPC ............. *H05K 3/3478* (2013.01); *H01L 24/97* (2013.01); *H05K 1/115* (2013.01); *H05K 3/284* (2013.01); *H05K 3/4015* (2013.01); *H01L 2224/16225* (2013.01); *H01L 2924/15192* (2013.01); *H01L 2924/15311* (2013.01);
(Continued)

(58) Field of Classification Search
CPC ..................... H05K 1/115; H05K 2201/09845; H05K 2201/09472; H05K 2201/09572; H05K 2201/09645
See application file for complete search history.

(56) References Cited

U.S. PATENT DOCUMENTS 4,787,853 A * 11/1988 Igarashi ................. H05K 1/111
174/266
5,337,219 A * 8/1994 Carr .................... H01L 23/5385
174/255

(Continued)

FOREIGN PATENT DOCUMENTS

JP    2010-80883 A    4/2010
KR    10-0970855 B1    7/2010
KR    2013-0056570 A    5/2013

*Primary Examiner* — Adrian S Wilson
(74) *Attorney, Agent, or Firm* — NSIP Law

(57) ABSTRACT

There are provided an electronic component module capable of increasing a degree of integration by mounting electronic components on both surfaces of a substrate, and a manufacturing method thereof. The electronic component module according to an exemplary embodiment of the present disclosure includes: a substrate; a plurality of electronic components mounted on both surfaces of the substrate; connection conductors each having one end bonded to one surface of the substrate using an conductive adhesive; and a molded portion having the connection conductor embedded therein and formed on one surface of the substrate, wherein the connection conductor may have at least one blocking member preventing a spread of the conductive adhesive.

6 Claims, 15 Drawing Sheets

(51) Int. Cl.
   *H05K 3/28*   (2006.01)
   *H05K 3/40*   (2006.01)
   *H01L 23/00*  (2006.01)
   *H05K 3/00*   (2006.01)
   *H05K 3/32*   (2006.01)

(52) U.S. Cl.
   CPC .......... H01L 2924/181 (2013.01); H01L 2924/19105 (2013.01); H01L 2924/19106 (2013.01); H05K 1/111 (2013.01); H05K 3/0052 (2013.01); H05K 3/321 (2013.01); H05K 2201/09409 (2013.01); H05K 2201/09436 (2013.01); H05K 2201/10318 (2013.01); H05K 2201/10424 (2013.01); H05K 2201/10787 (2013.01); H05K 2203/0228 (2013.01); H05K 2203/1316 (2013.01)

(56) References Cited

U.S. PATENT DOCUMENTS

| | | | | |
|---|---|---|---|---|
| 5,406,034 A * | 4/1995 | Frei | ............... | H05K 1/115 174/262 |
| 6,663,442 B1 * | 12/2003 | Helster | ............... | H01R 9/091 174/266 |
| 7,615,707 B2 * | 11/2009 | Lin | ............... | H05K 3/0094 174/261 |
| 8,139,368 B2 | 3/2012 | Nomura | | |
| 2002/0079570 A1 * | 6/2002 | Ho | ............... | H01L 23/13 257/697 |
| 2004/0166617 A1 * | 8/2004 | Moriizumi | ............... | H01L 23/49811 438/197 |
| 2005/0184371 A1 * | 8/2005 | Yang | ............... | H01L 23/49816 257/678 |
| 2006/0220210 A1 * | 10/2006 | Karnezos | ............... | H01L 23/3135 257/686 |
| 2008/0078572 A1 * | 4/2008 | Watanabe | ............... | H05K 3/325 174/262 |
| 2008/0169119 A1 * | 7/2008 | Palmeri | ............... | H05K 3/225 174/250 |
| 2009/0224381 A1 | 9/2009 | Ishihara et al. | | |
| 2010/0084178 A1 * | 4/2010 | Sweeney | ............... | H05K 1/113 174/262 |
| 2011/0186996 A1 * | 8/2011 | Takahashi | ............... | H01L 25/0657 257/737 |
| 2012/0320536 A1 | 12/2012 | Yamamoto | | |
| 2013/0127025 A1 | 5/2013 | Cho | | |

* cited by examiner

"A"

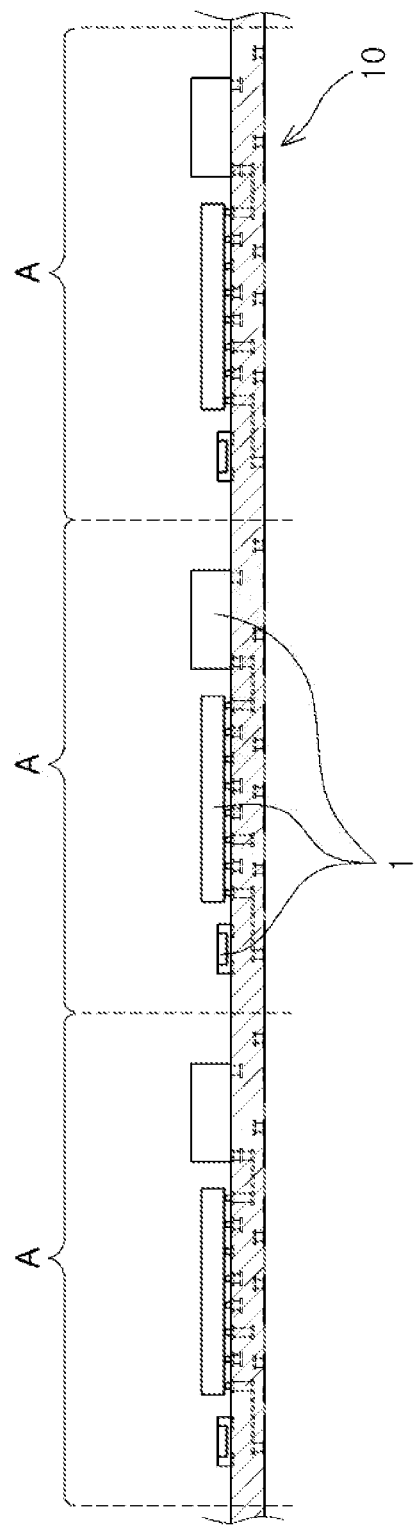

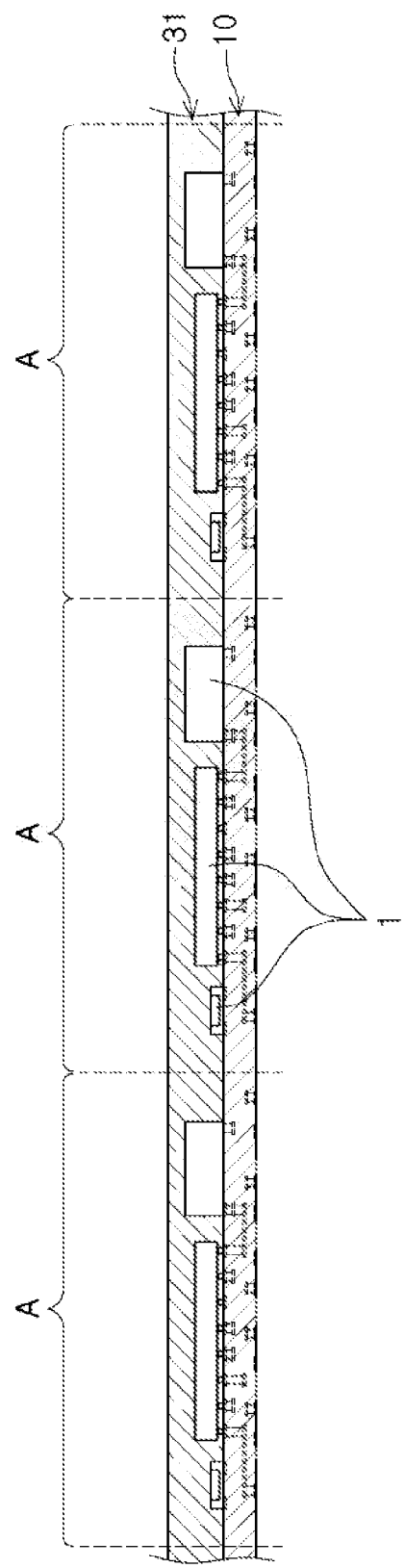

"B"

ELECTRONIC COMPONENT MODULE AND MANUFACTURING METHOD THEREOF

CROSS-REFERENCE TO RELATED APPLICATION

This application claims the benefit of Korean Patent Application No. 10-2014-0013460 filed on Feb. 6, 2014, with the Korean Intellectual Property Office, the disclosure of which is incorporated herein by reference.

BACKGROUND

The present disclosure relates to an electronic component module and a manufacturing method thereof, and more particularly, to an electronic component module having an increased degree of integration by mounting electronic components on both surfaces of a substrate and a manufacturing method thereof.

Market demand for portable terminals has recently increased in the field of electronic products. Accordingly, processes of miniaturization and lightening of electronic components mounted in electronic products have been required on an on-going basis.

In order to realize the miniaturization and lightening of electronic components, various types of technology, such as system on chip (SOC) technology for installing a plurality of individual elements on a single chip, system in package (SIP) technology for integrating a plurality of individual elements in a single package, and the like, as well as a technology for reducing respective sizes of the mounted components, are required.

Meanwhile, in order to manufacture an electronic component module having a small size and high performance, a structure in which electronic components are mounted on both surfaces of a substrate has also been developed.

However, in the case in which electronic components are mounted on both surfaces of a substrate, it may be difficult to form an external connection terminal on the substrate.

That is, since the electronic components are mounted on both surfaces of the substrate, a position in which the external connection terminal is to be formed is not clearly specified. Therefore, a double-sided mounting type electronic component module allowing for an external connection terminal to be easily formed and a manufacturing method allowing for the electronic component module to be easily manufactured has been demanded.

RELATED ART DOCUMENT (Patent Document 1) Korean Patent Laid-Open Publication No. 2013-0056570

SUMMARY

An aspect of the present disclosure may provide a double-sided mounting type electronic component module having electronic components mounted on both surfaces of a substrate.

Another aspect of the present disclosure may provide a method of easily manufacturing a double-sided mounting type electronic component module.

According to an aspect of the present disclosure, an electronic component module may include: a substrate; a plurality of electronic components mounted on both surfaces of the substrate; connection conductors each having one end bonded to one surface of the substrate using an conductive adhesive; and a molded portion having the connection conductor embedded therein and formed on one surface of the substrate, wherein the connection conductor may have at least one blocking member preventing a spread of the conductive adhesive.

The blocking member may protrude from a portion of the connection conductor adjacent to one end of the connection conductor in an outer diameter direction thereof such that the blocking member is disposed between the center of the connection conductor and one end of the connection conductor.

The spread of the conductive adhesive in a vertical direction and a horizontal direction may be blocked by the blocking member.

The conductive adhesive may be disposed between the blocking member of the connection conductor and the substrate.

An edge of the blocking member may be chamfered to form a chamfered surface.

The conductive adhesive may be formed to have a size corresponding to a range having a protruded length of the blocking member as a radius.

The connection conductor may be formed as a metal post.

At least two of the connection conductors disposed to be adjacent to each other may have respective blocking members disposed opposite to each other.

The electronic component module may further include a plurality of external connection terminals bonded to the connection conductors.

According to another aspect of the present disclosure, a method of manufacturing an electronic component module may include: preparing a substrate; mounting electronic components on an upper surface of the substrate; forming a first molded portion on the upper surface of the substrate; mounting the electronic components together with a lead frame on a lower surface of the substrate; forming connection conductors by cutting portions of the lead frame; and forming a second molded portion to have the connection conductors embedded therein.

The mounting of the electronic components together with the lead frame may include: applying a solder paste on the lower surface of the substrate; seating the electronic components and the lead frame on the solder paste; and fixing and bonding the electronic components and the connection conductors to the lower surface of the substrate by melting and curing the solder paste.

The method may further include forming external connection terminals on the connection conductors after the forming of the second molded portion.

The lead frame may include: the plurality of connection conductors mounted on the substrate; dummy regions disposed around the connection conductors; and connectors connecting the connection conductors to each other and connecting the connection conductors to the dummy regions.

The connector may be formed to be protruded from a portion of the connection conductor between the center of the connection conductor and one end of the connection conductor in an outer diameter direction of the connection conductor.

The forming of the connection conductors may include cutting the connectors of the lead frame with portions of the connectors remaining in the connection conductors.

The connectors of the lead frame may have at least one blocking groove formed therein.

The forming of the connection conductors may include cutting the connectors such that portions of the blocking grooves remain in the portions of the connectors remaining in the connection conductors.

The substrate may be prepared to have a plurality of individual mounting regions formed thereon, and the lead frame having a plurality of through holes formed therein may be mounted on the substrate.

According to another aspect of the present disclosure, a method of manufacturing an electronic component module may include: preparing a substrate; mounting electronic components and a lead frame on a surface of the substrate; forming connection conductors by cutting portions of the lead frame; and forming a molded portion on the surface of the substrate.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 5A through 5I are cross-sectional views illustrating a method of manufacturing an electronic component module according to an exemplary embodiment of the present disclosure;

DETAILED DESCRIPTION

Figure 1:
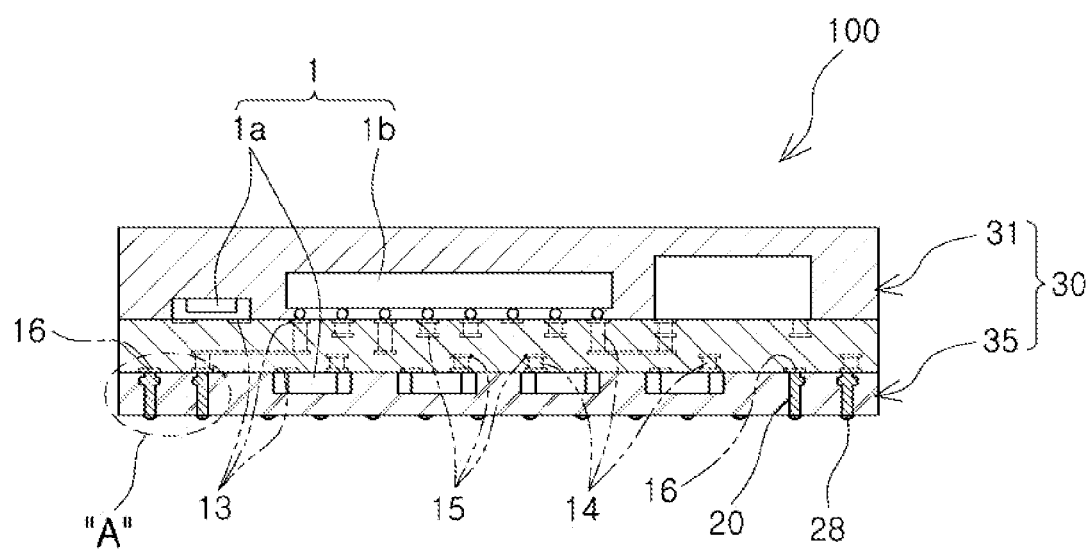
FIG. 1 is a cross-sectional view schematically illustrating an electronic component module according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
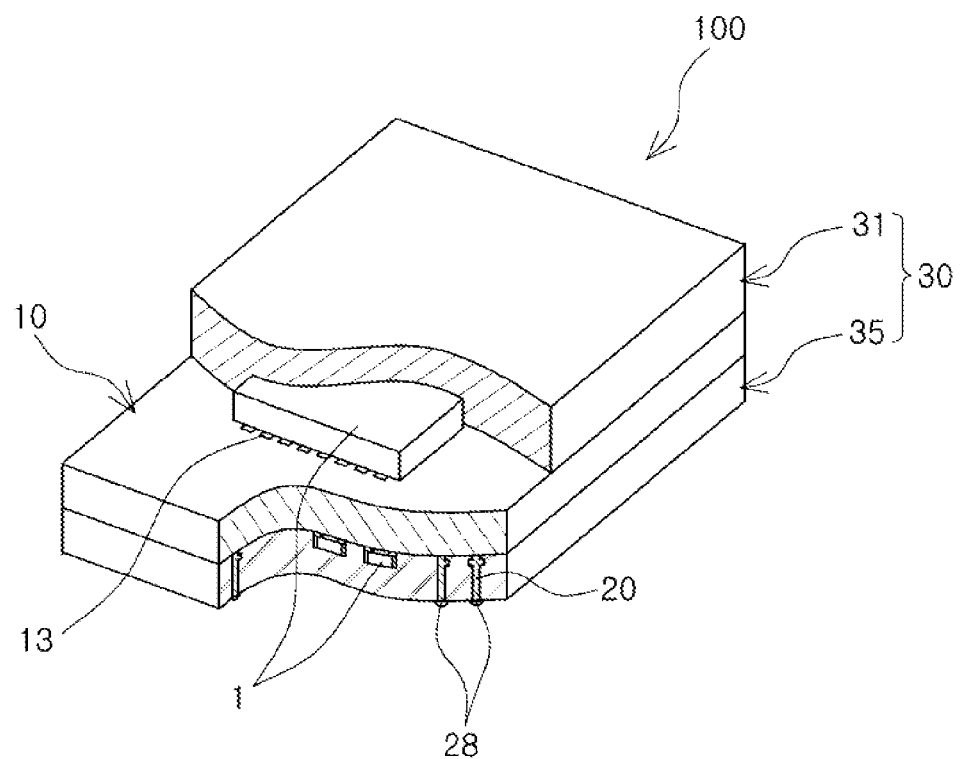
FIG. 2 is a partially cut-away perspective view illustrating an inner portion of the electronic component module of FIG. 1.
Figure 3:
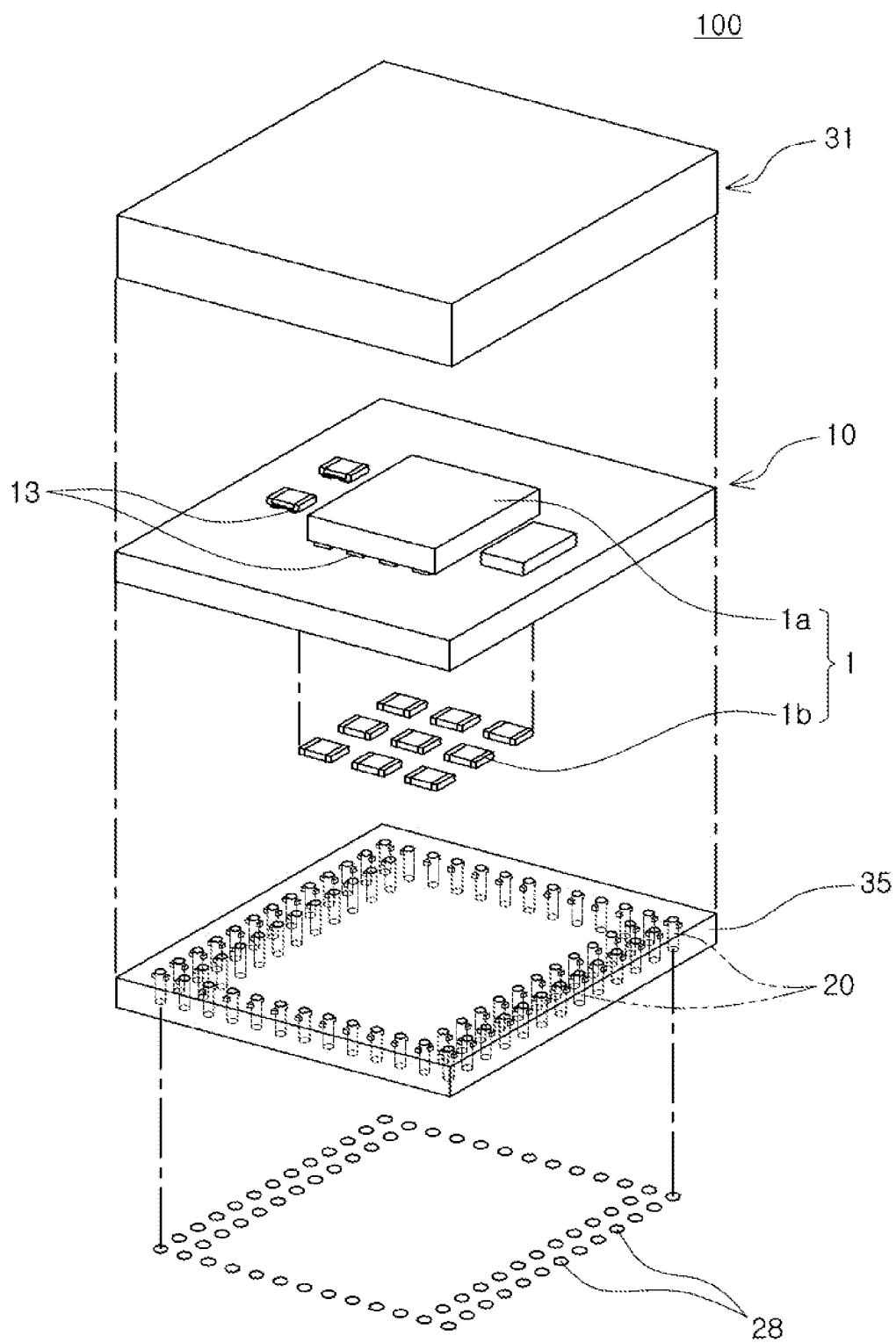
FIG. 3 is an exploded perspective view of the electronic component module of FIG. 1.
Figure 4:
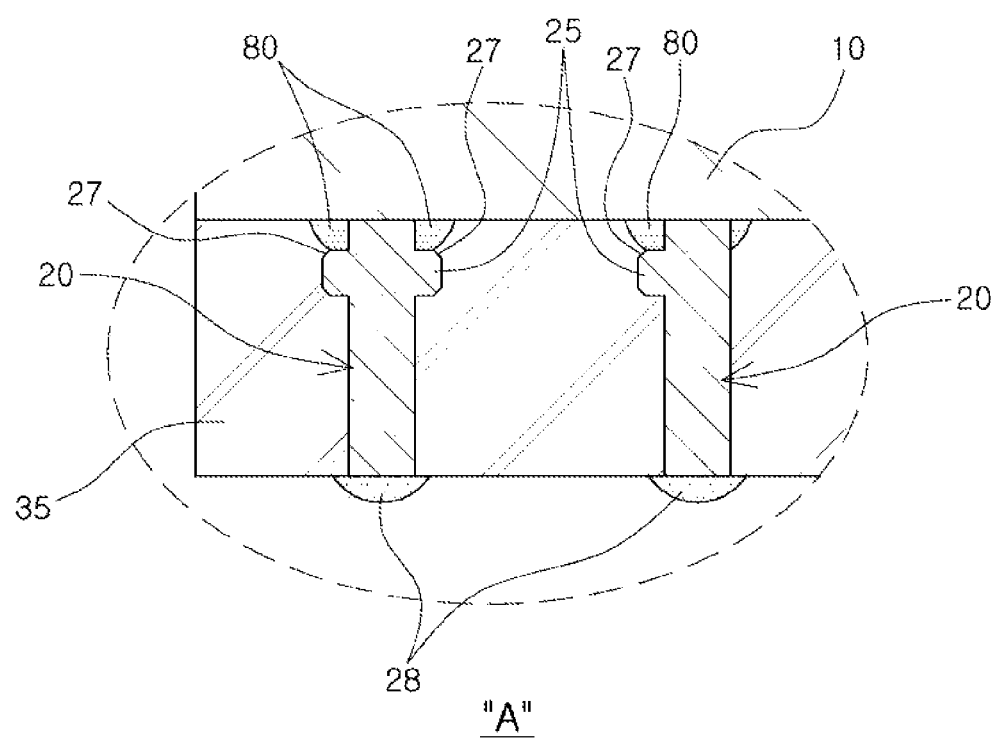
FIG. 4 is an enlarged cross-sectional view of part A of FIG. 1.

FIG. 1 is a cross-sectional view schematically illustrating an electronic component module according to an exemplary embodiment of the present disclosure, and FIG. 2 is a partially cut-away perspective view illustrating an inner portion of the electronic component module of FIG. 1. In addition, FIG. 3 is an exploded perspective view of the electronic component module of FIG. 1, and FIG. 4 is an enlarged cross-sectional view of part A of FIG. 1.

Referring to FIGS. 1 through 4, an electronic component module 100 according to an exemplary embodiment of the present disclosure may be configured to include an electronic component 1, a substrate 10, a molded portion 30, and a connection conductor 20.

The electronic component 1 may include various elements such as a passive element 1a and an active element 1b and all elements capable of being mounted on the substrate may be used as the electronic component 1.

The electronic component 1 may be mounted on both upper and lower surfaces of the substrate 10. FIG. 1 illustrates that both the active element 1b and the passive element 1a are mounted on the upper surface of the substrate 10 and only the passive elements 1a are mounted on the lower surface of the substrate 10 by way of example. However, the present disclosure is not limited to thereto, and the electronic components 1 may be disposed on both surfaces of the substrate 10 in various structures depending on sizes or shapes of the electronic components and a design of the electronic component module 100.

The substrate 10 has at least one electronic component 1 mounted on each of both surfaces thereof. As the substrate 10, various kinds of substrates (for example, a ceramic substrate, a printed circuit board, a flexible substrate, and the like) well known in the art may be used. In addition, the substrate 10 may include mounting electrodes 13 or wiring patterns (not shown) formed on both surfaces thereof, wherein the mounting electrodes 13 are used for mounting the electronic component 1 thereon and the wiring patterns electrically interconnect the mounting electrodes 13.

The substrate 10 according to this exemplary embodiment of the present disclosure may be a multilayer substrate including a plurality of layers, and circuit patterns 15 for electrical connections may be formed between the respective layers.

In addition, the substrate 10 according to this exemplary embodiment of the present disclosure may include conductive visas 14 electrically connecting the mounting electrodes 13 formed on both surfaces of the substrate 10 to the circuit patterns 15 formed inside the substrate 10.

In addition, the substrate 10 according to this exemplary embodiment of the present disclosure may include cavities (not shown) formed therein, wherein the cavities allow the electronic components 1 to be embedded in the substrate 10.

In addition, the substrate 10 according to this exemplary embodiment of the present disclosure has a connection pad 16 formed on the lower surface thereof. The connection pad 16 may be connected to the connection conductor 20 and may be electrically connected to an external connection terminal 28 through the connection conductor 20.

Therefore, the connection pad 16 on the lower surface of the substrate 10 may be positioned to face an upper surface of the connection conductor 20 when the connection conductor 20 is coupled to the substrate 10, and a plurality of connection pads 16 may be disposed in various forms, if necessary.

Meanwhile, the substrate 10 according to this exemplary embodiment of the present disclosure may have a plurality of mounting regions repeatedly disposed in order to simultaneously manufacture a plurality of individual modules. More particularly, the substrate 10 may have a quadrangular shape having a wide area or a long strip shape. In this case, the electronic component module may be manufactured for each of the plurality of mounting regions.

The molded portion 30 may include a first molded portion 31 formed on the upper surface of the substrate 10 and a second molded portion 35 formed on the lower surface of the substrate 10.

The molded portion 30 may seal the electronic components 1 mounted on both surfaces of the substrate 10. In addition, the molded portion 30 may fill space between the electronic components 1 mounted on the substrate 10 to prevent electrical short circuit between the electronic components 1. Furthermore, the molded portion 30 may enclose the exterior of the electronic component 1 and fix the electronic component 1 to the substrate 10 to thereby protect the electronic component 1 from external impacts.

The molded portion 30 may be formed of an insulating material containing a resin material such as an epoxy molding compound (EMC) or the like.

The first molded portion 31 according to the exemplary embodiment of the present disclosure may be formed to cover the entirety of one surface of the substrate 10. In the exemplary embodiment of the present disclosure, all the electronic components 1 are illustrated as being embedded in the first molded portion 31 by way of example. However, the present disclosure is not limited thereto, but various modifications may be made. For example, a portion of at least one of the electronic components 1 may be exposed to the outside of the first molded portion 31.

The second molded portion 35 may be formed on the lower surface of the substrate 10 while having the connection conductor 20 embedded therein.

The second molded portion 35 may be formed to have all the electronic components 1 embedded therein, similar to the first molded portion 31. However, a portion of the electronic components 1 may be exposed to the outside of second molded portion 35.

The connection conductor 20 may be formed as a metal post and may be bonded to at least one surface of the substrate 10. Specifically, one end of the connection conductor 20 may be connected to the lower surface of the substrate 10 and the other end thereof may be connected to the external connection terminal 28. Therefore, the connection conductor 20 according to the exemplary embodiment of the present disclosure may penetrate through the molded portion 30 to thereby be disposed within the molded portion 30.

The connection conductor 20 may be formed of a conductive material and may be formed of copper, silver, aluminum, or an alloy thereof. In addition, the connection conductor 20 may be bonded to the substrate by a conductive adhesive such as a solder.

Particularly, as shown in FIG. 4, the connection conductor 20 according to the exemplary embodiment of the present disclosure may have a blocking member 25 spaced apart from one end thereof, that is, a portion thereof bonded to the substrate 10, by a predetermined distance.

The blocking member 25 may protrude from a portion of the connection conductor 20 adjacent to one end thereof in an outer diameter direction thereof so that it is disposed between the center of the connection conductor 20 and one end of the connection conductor 20. In addition, the connection conductor 20 may have a single blocking member 25 or a plurality of blocking members 25.

In the case in which the plurality of blocking members 25 are formed, they may protrude in different directions. For example, the plurality of blocking members 25 may protrude from the connection conductor 20 while forming an angle of 90° or 180° with respect to each other.

The blocking member 25 may be provided to prevent the solder bonding the connection conductor 20 and the substrate 10 from flowing or spreading to the other end of the connection conductor 20 when the connection conductor 20 is mounted on the substrate 10. That is, when the solder is melted during a soldering process, the blocking member 25 may prevent the melted solder from being spread in a vertical direction (downward) along a surface of the connection conductor 20.

Therefore, the blocking member 25 may be spaced apart from one end of the connection conductor 20 by a distance corresponding to a height of the solder with respect to the bonding portion of the substrate and the connection conductor 20.

Meanwhile, in the soldering process, the melted solder may be spread in a horizontal direction (a direction in which the blocking member is protruded).

In order to prevent this, an edge of the blocking member 25 according to this exemplary embodiment to of the present disclosure may be subjected to a chamfering process.

Therefore, the spread of the melted solder in the horizontal direction may be prevented by an edge of a chamfered surface 27 and surface tension of the melted solder.

As such, the blocking member 25 according to the exemplary embodiment of the present disclosure may serve to prevent the melted solder from being spread in both the vertical direction and the horizontal direction.

Thereby, a soldered portion 80 formed using a conductive adhesive may be disposed in a space between the blocking member 25 of the connection conductor 20 and the substrate 10. In addition, the soldered portion 80 may be formed to have a size corresponding to a range having a protruded length of the blocking member 25 as a radius.

Meanwhile, the connection conductor 20 according to the exemplary embodiment of the present disclosure may be formed to have a cylindrical shape. However, the shape of the connection conductor may be variously changed. For example, the connection conductor 20 may be formed to have a conical shape having a cross-sectional area narrowed toward one end or the other end thereof, or may be formed to have a polygonal cross-section.

The external connection terminal 28 may be bonded to the other end of the connection conductor 20. The external connection terminal 28 may electrically and physically connect the electronic component module 100 to a main substrate (not shown) on which the electronic component module 100 is to be mounted. The external connection terminal 28 may be formed as a bump, but is not limited thereto. For example, the external connection terminal 28 may be formed in various forms such as a solder ball, and the like.

Meanwhile, in the exemplary embodiment of the present disclosure, the connection conductor 20 is disposed within the second molded portion 35 by way of example. However, the configuration thereof is not limited thereto. The connection conductor 20 may be disposed within the first molded portion 31 in the same manner, if necessary.

The electronic component module 100 according to the exemplary embodiment of the present disclosure having the above-described configuration may have the electronic components 1 mounted on both surfaces of the substrate 10. In addition, the substrate 10 and the external connection terminal 28 may be electrically connected to each other through the connection conductor 20 disposed on the lower surface of the substrate 10.

As a result, the plurality of electronic components 1 may be mounted on a single substrate 10, thereby increasing a degree of integration.

In addition, since the substrate 10 and the connection terminal 28 are electrically connected to each other through the connection conductor 20, the formation of the external connection terminal 28 in a double-sided molding structure may be facilitated.

Next, a method of manufacturing an electronic component module according to an exemplary embodiment of the present disclosure will be described.

FIGS. 5A through 5I are cross-sectional views illustrating a method of manufacturing an electronic component module according to an exemplary embodiment of the present disclosure.

Figure 5A:
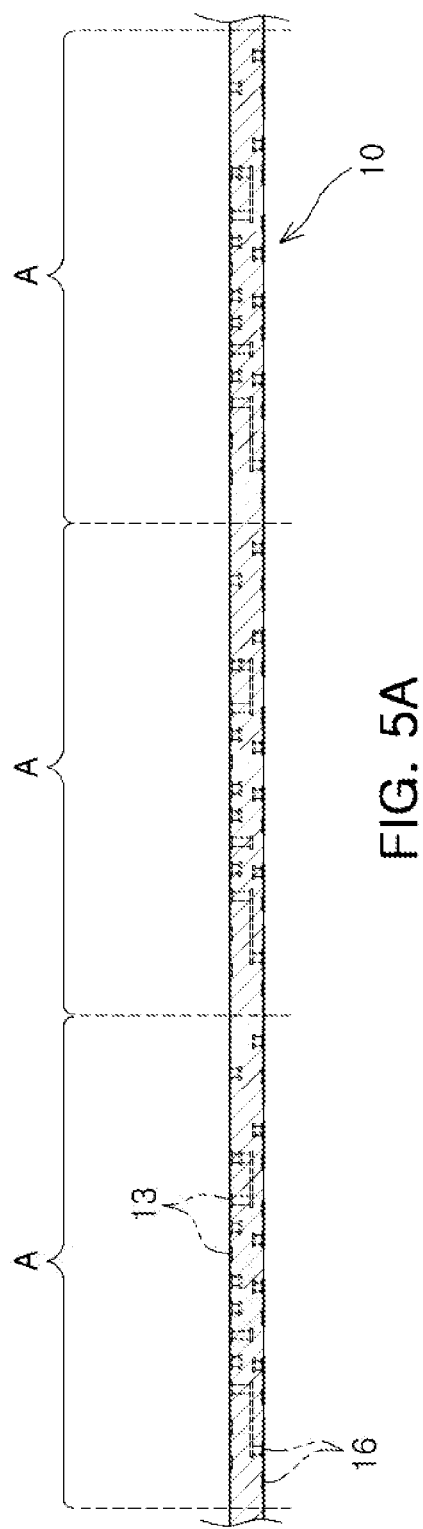

As shown in FIG. 5A, the substrate 10 is first prepared. As described above, the substrate 10 may be a multilayer substrate and may have the mounting electrodes 13 formed on both surfaces thereof. In addition, the connection pad 16 may be formed on the lower surface of the substrate 10.

Particularly, the prepared substrate 10 may have a plurality of mounting regions A repeatedly disposed and may have a quadrangular shape having a wide area or a long strip shape.

The substrate 10 is intended to simultaneously manufacture a plurality of individual modules, and the plurality of individual module mounting regions A are partitioned on the substrate 10. Accordingly, the electronic component module may be manufactured for each of the plurality of individual module mounting regions A.

Next, as shown in FIG. 5B, the electronic components 1 may be mounted on one surface, that is, the upper surface of the substrate 10. The operation of mounting the electronic components 1 may be performed by the following processes: a solder paste is printed on the mounting electrodes 13 formed on one surface of the substrate 10 by a screen printing method, or the like, the electronic components 1 are seated thereon, and the solder paste is then cured by applying heat thereto.

In this case, the same electronic components 1 may be arranged on each of the module mounting regions A in the same manner.

Next, as shown in FIG. 5C, the first molded portion 31 may be formed on one surface of the substrate 10 to seal the electronic components 1. Here, the first molded portion may be formed by disposing the substrate 10 having the electronic components 1 mounted thereon in a mold and then injecting a molding resin into the mold. As the first molded portion 31 is formed, the electronic components 1 mounted on one surface, that is, the upper surface of the substrate 10 may be protected from external impacts or the like by the first molded portion 31.

Meanwhile, the first molded portion 31 according to the exemplary embodiment of the present disclosure may be integrally formed to cover all the individual module mounting regions A on the substrate 10. However, the present disclosure is not limited thereto, and the first molded portion 31 may be may be independently formed to be separated for each of the individual module mounting regions A, as necessary.

Figure 5D:
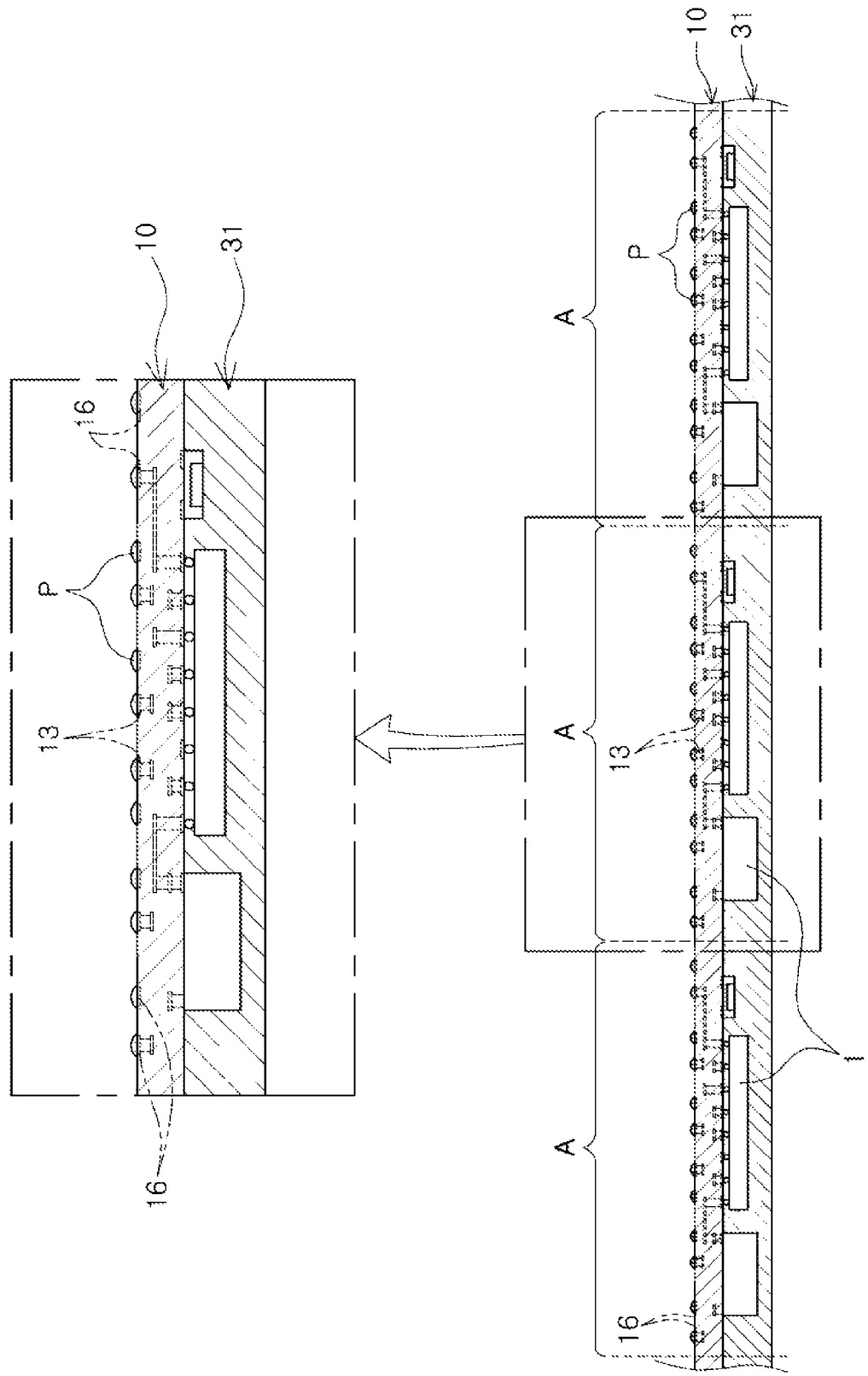

Next, as shown in FIG. 5D, a solder paste P may be printed on the other surface, that is, a lower surface of the substrate 10 opposing one surface thereof having the first molded portion 31 formed thereon. In this case, the solder paste P may be printed on both the mounting electrodes 13 and the connection pads 16.

Figure 5E:
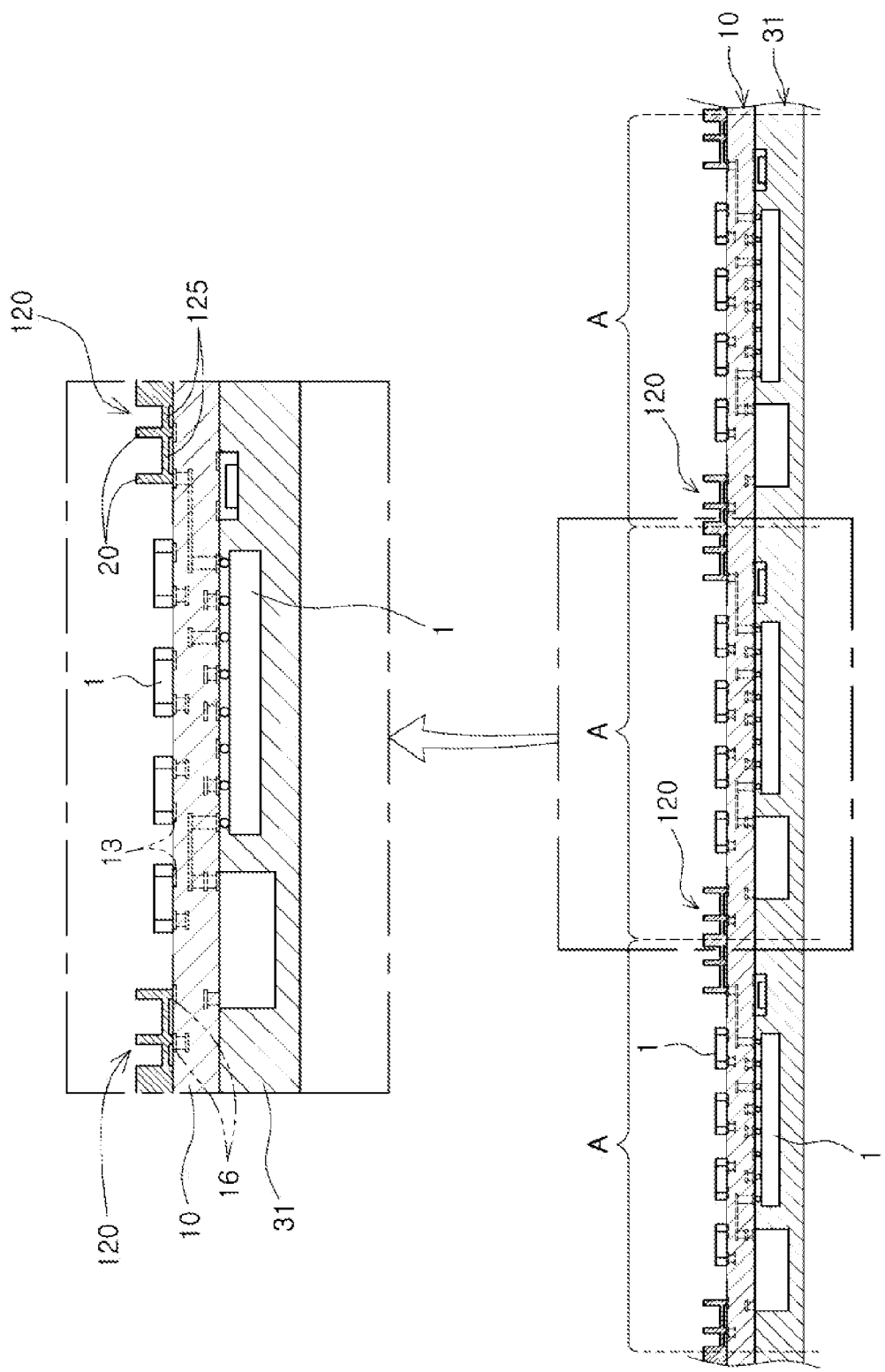

Next, as shown in FIG. 5E, the electronic components 1 and a lead frame 120 may be mounted on the other surface of the substrate 10 having the solder paste (not shown) printed thereon.

This operation includes seating the electronic components 1 on the mounting electrodes 13 and seating the lead frame 120 on the connection pads 16. After the electronic components 1 are first seated, the lead frame 120 may then be seated. However, the present disclosure is not limited thereto. For example, the lead frame 120 may first be seated or the lead frame 120 and the electronic components 1 may simultaneously be seated.

Here, the lead frame 120 according to this exemplary embodiment of the present disclosure may be used in forming the connection conductors 20.

Figure 6:
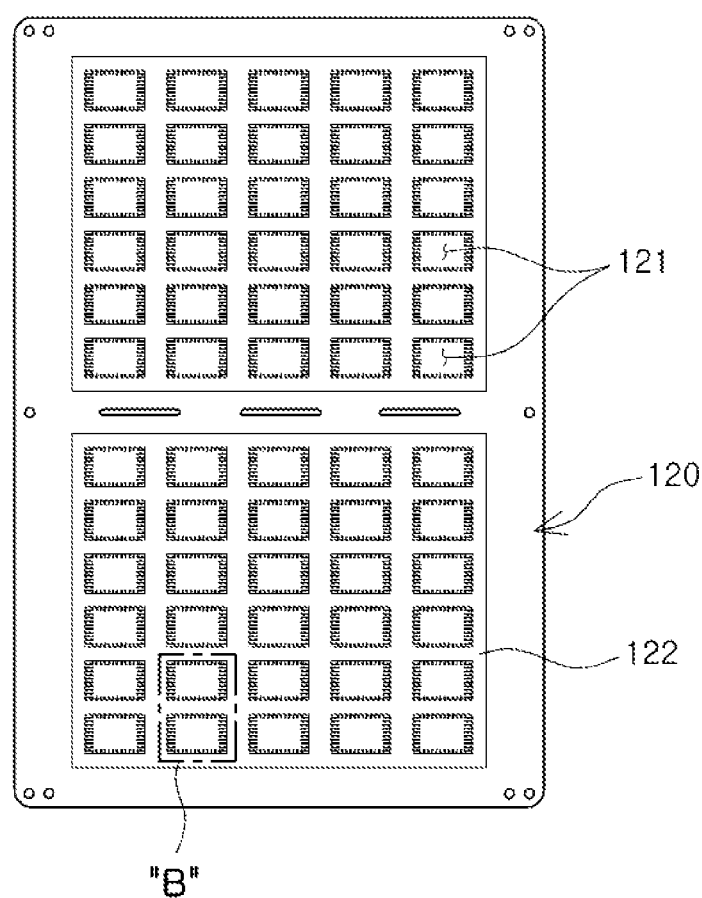
FIG. 6 is a plan view schematically illustrating a lead frame according to an exemplary embodiment of the present disclosure.
Figure 7:
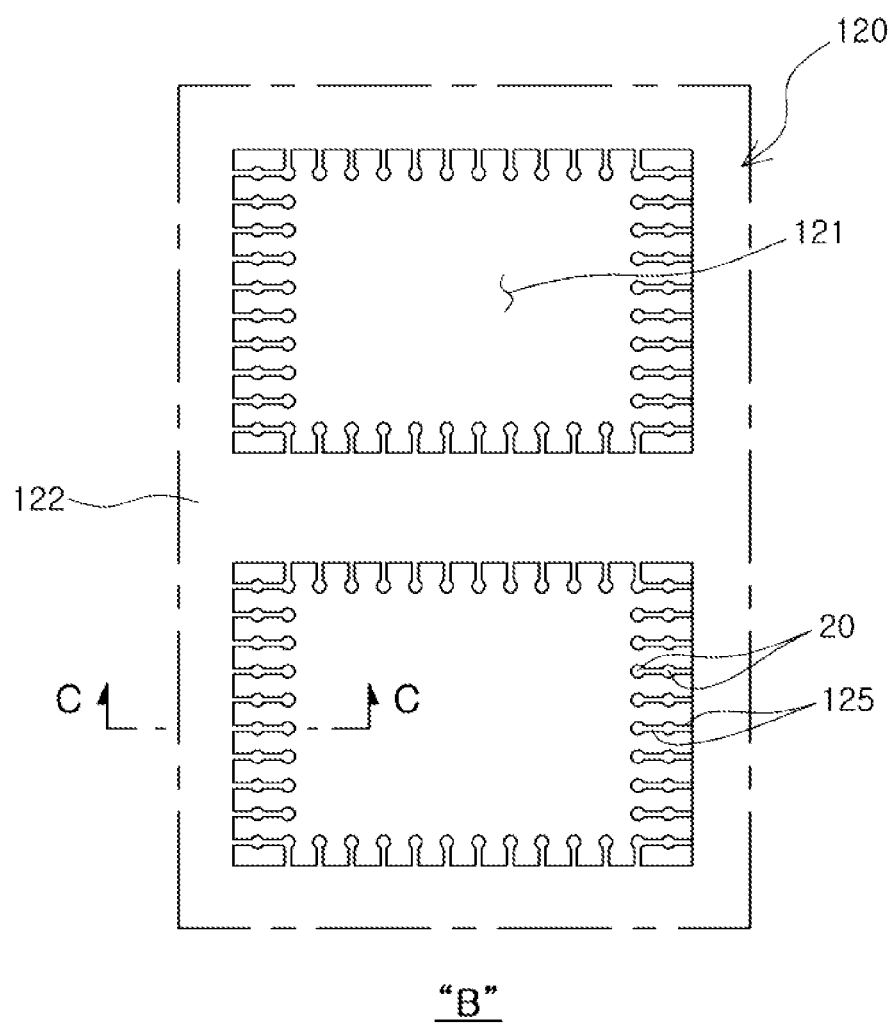
FIG. 7 is an enlarged plan view of part B of FIG. 6.

FIG. 6 is a plan view schematically illustrating a lead frame according to an exemplary embodiment of the present disclosure, and FIG. 7 is an enlarged plan view of part B of FIG. 6. In addition, FIG. 8 is a cross-sectional view taken along line C-C of FIG. 7.

Figure 8:
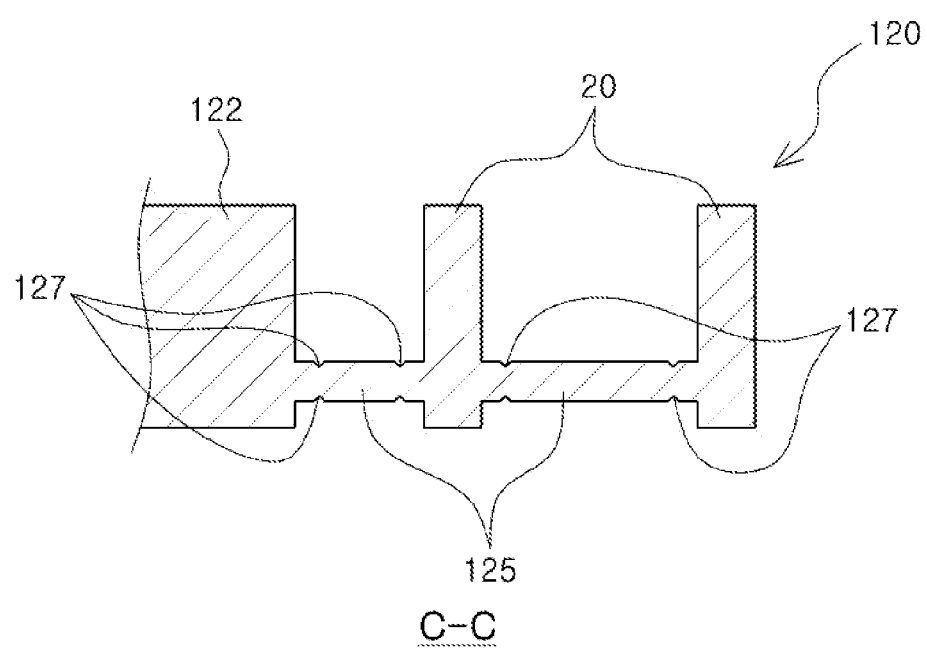
FIG. 8 is a cross-sectional view taken along line C-C of FIG. 7.

Referring to FIGS. 6 through 8, the lead frame 120 according to the exemplary embodiment of the present disclosure may include connection conductors 20, and connectors 125 connecting the connection conductors 20 to each other, and dummy regions 122.

The lead frame 120 according to this exemplary embodiment of the present disclosure may have through-holes 121 formed therein, wherein the plurality of connection conductors 20 may be disposed in the through-hole 121. In this case, the through-hole 121 may be formed to have a size and a shape corresponding to each mounting region of the substrate 10.

The connection conductors 20 may be disposed in the through-hole 121 and may be disposed in positions corresponding to the connection pads 16 of the substrate 10.

The connector 125 may connect the connection conductors 20 disposed to be adjacent to each other. Therefore, one connection conductor 20 may be physically connected and fixed to another connection conductor 20 through a single or a plurality of connectors 125.

In addition, the connectors 125 may connect the connection conductors 20 and the dummy regions 122 to each other. Therefore, the connection conductors 20 may be fixedly disposed in exact positions within the through-hole 121 by the connectors 125.

The connector 125 may be disposed to be adjacent to one end of the connection conductor 20 as shown in FIG. 8. Here, one end of the connection conductor 20 may refer to a portion thereof bonded to the substrate 10.

The connector 125 may become the blocking member 25 of the connection conductor 20. Therefore, the connector 125 may be spaced apart from one end of the connection conductor 20 by a distance corresponding to a height of the solder formed at the bonding portion of the substrate 10 and the connection conductor 20, similar to the case of the blocking member 25 as described above.

In addition, the connector 125 may have at least one blocking groove 127 formed therein. The blocking groove 127 may be provided for forming the chamfered surface 27 of the blocking member 25. Therefore, the blocking groove 127 may be disposed in a position corresponding to an edge of the blocking member 25.

In addition, in the case in which each of the connection conductors 20 is disposed at both ends of one connector 125, two blocking members 25 may be formed with respect to one connector 125. In this case, two blocking grooves 127 may also be formed in one connector 125.

In this exemplary embodiment of the present disclosure, the blocking groove 127 has a V-like cross-section by way of example. However, the present disclosure is not limited thereto. The blocking groove 127 may have various shapes as long as the chamfered surface 27 may be formed.

In this exemplary embodiment of the present disclosure, the blocking grooves 127 are formed in upper and lower surfaces of the connector 125 by way of example. Such a configuration is derived from an attempt to facilitate the formation of the blocking grooves 127 using a pressing process, and the configuration thereof is not limited thereto.

Meanwhile, the lead frame 120 according to the exemplary embodiment of the present disclosure may have the through-holes 121 and the connection conductors 20 repeatedly formed to correspond to the shape of the substrate having the plurality of mounting regions A repeatedly disposed. However, the configuration thereof is not limited thereto.

For example, the lead frame 120 may be configured of a plurality of independent lead frames having sizes allowing for the lead frames to be attached to the individual module mounting regions A of the substrate 10, respectively. That is, the plurality of lead frames having the same shape may be prepared and may be repeatedly disposed on all the individual module mounting regions A.

After the electronic components 1 and the lead frame 120 are seated on the other surface of the substrate 10 as described above, heat may be applied thereto to cure the solder paste (P of FIG. 5D). The solder paste P may be melted and cured during this process to thereby form the soldered portions (80 of FIG. 4), and the electronic components 1 and the connection conductors 20 of the lead frame 120 which are seated on the lower surface of the surface 10 may be firmly fixed to the substrate 10 by the soldered portions 80 so that they are electrically and physically connected to the substrate 10.

In this process, the spread of the melted solder in which the solder paste P is melted in the vertical direction may be blocked by the connectors 125 and the spread thereof in the horizontal direction may be blocked by the blocking grooves 127. Therefore, the soldered portions 80 may be formed in a range without departing from the connectors 125 and the blocking grooves 127. Therefore, the soldered portions 80 may be formed as shown in FIG. 4 or FIG. 5I.

Figure 5F:
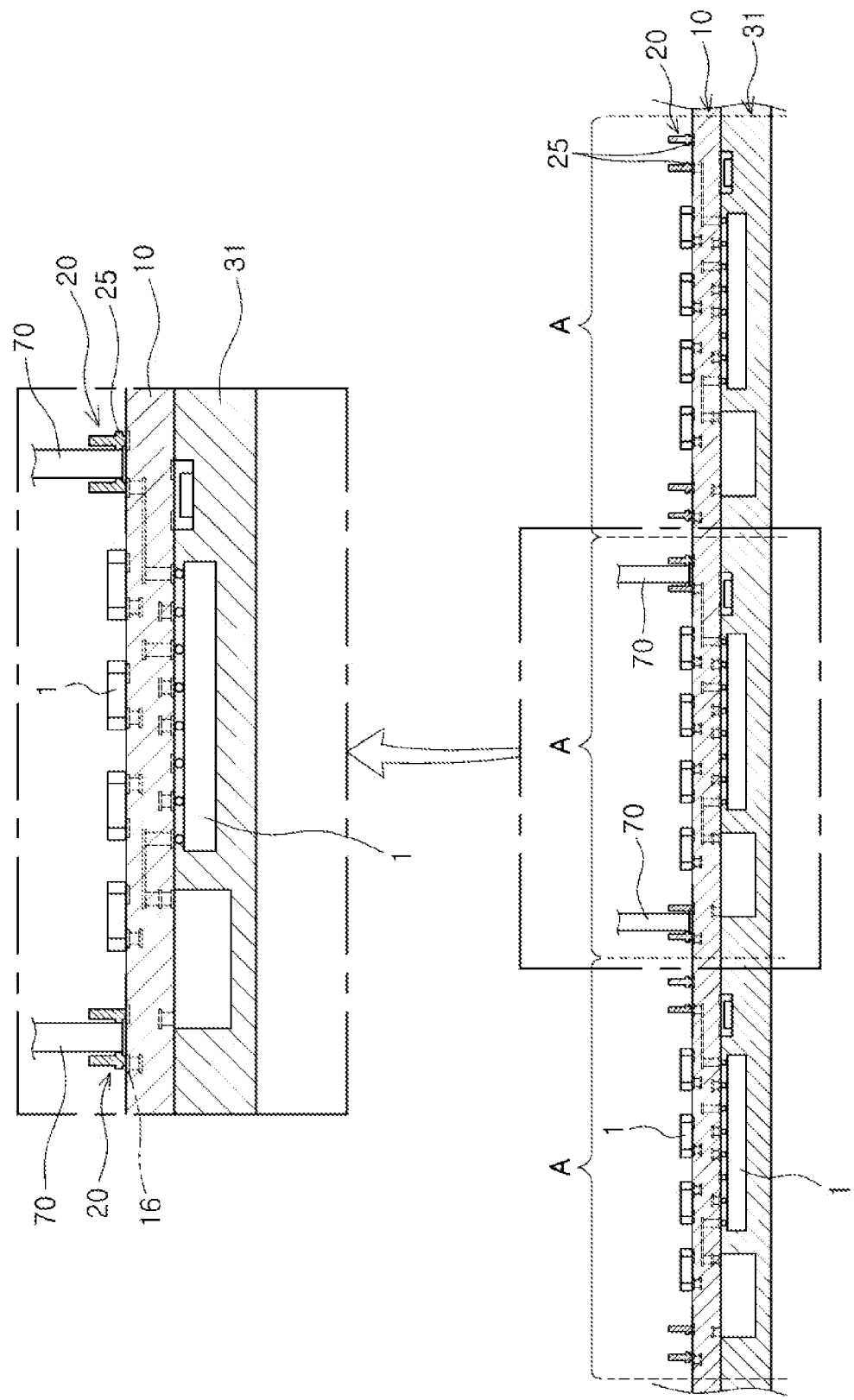

Next, as shown in FIG. 5F, the connection conductors 20 may be electrically separated from each other. The operation of electrically separating the connection conductors 20 may be performed by cutting all the connectors 125 using a blade 70.

In this case, the blade 70 may cut the connectors 125 in positions in which the blocking grooves 127 are formed. Specifically, portions of the connectors 125 may be removed in a manner such that a portion of the blocking groove 127 is remained and the other portion thereof is removed.

Therefore, the remaining connector 125 may be formed as the blocking member 25. In addition, the remaining blocking groove 127 may be formed as the chamfered surface 27.

In addition, as the remaining connector 125 is formed as the blocking member 25, two connection conductors 20 sharing the same connector 125 may be formed so that respective blocking members 25 thereof are opposite to each other and are disposed on a straight line.

In addition, since the connectors 125 connecting the connection conductors 20 and the dummy regions 122 to each other are also cut in this process, only the connection conductors 20 may be finally left on the substrate and the dummy regions 122 of the lead frame 120 may be separated and removed from the connection terminals.

Figure 5G:
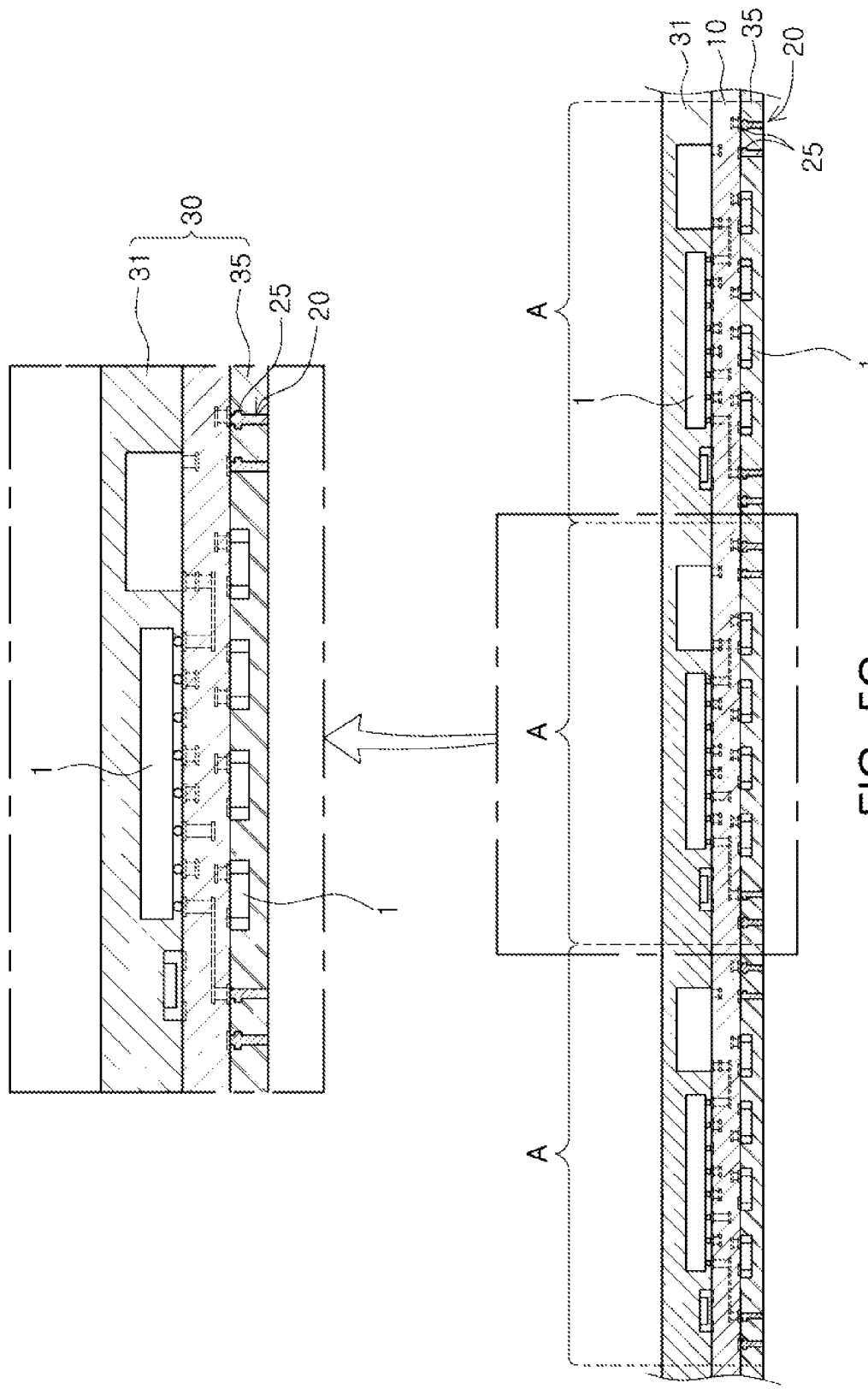

Next, as shown in FIG. 5G, the second molded portion 35 may be formed on the lower surface of the substrate 10. In this operation, the second molded portion 35 may be formed by disposing the substrate 10 having the electronic components 1 and the connection conductors 20 mounted on the lower surface thereof in a mold and then injecting a molding resin into the mold, similar to the first molded portion 31.

The second molded portion 35 may allow the electronic components 1 and the connection conductors 20 mounted on the lower surface of the substrate 10 to be embedded therein.

Meanwhile, since the blocking member 25 of the connection conductor 20 is vertically protruded from the connection conductor 20, the connection conductor 20 may be more firmly embedded in the second molded portion 35 by the blocking member 25. That is, the blocking member 25 also serves to prevent the connection conductor 20 from being removed or separated from the second molded portion 35.

In addition, the second molded portion 35 according to this exemplary embodiment of the present disclosure may be integrally formed to cover the entirety of the individual module mounting regions A. However, the configuration thereof is not limited thereto. The second molded portion 35 may be separated for each of the individual module mounting regions A and may independently cover each of the individual module mounting regions A.

Figure 5H:
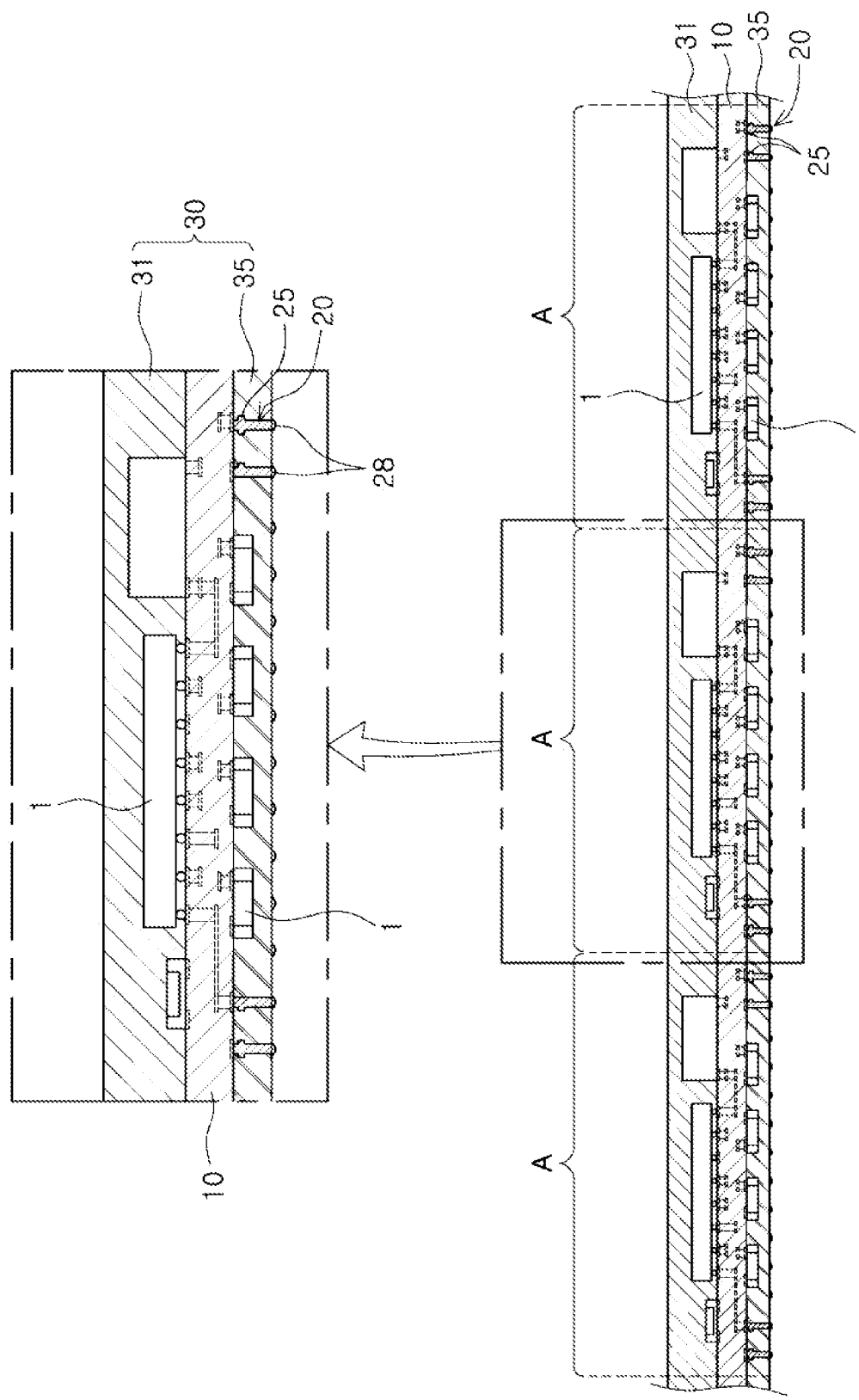
Figure 5I:
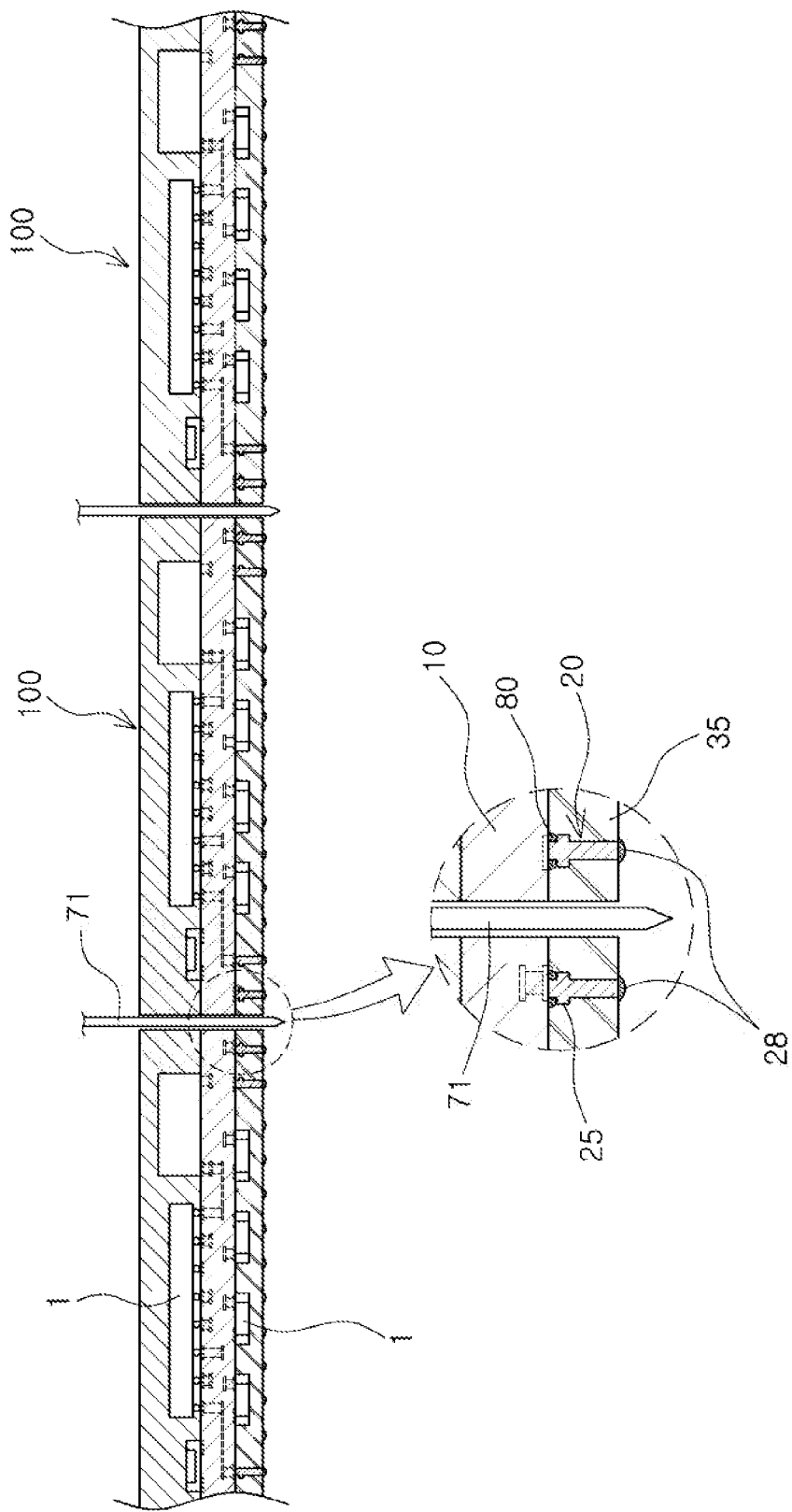

Next, as shown in FIG. 5H, the external connection terminals 28 may be formed on the other end of the connection conductor 20. The external connection terminal 28 may be formed as a bump, but is not limited thereto. For example, the external connection terminal 28 may be formed in various forms such as a solder ball, and the like.

Finally, as shown in FIG. 5I, individual electronic component modules 100 may be formed by cutting the substrate 10 having the molded portion 30 formed thereon.

This operation may be performed by cutting the substrate 10 having the molded portion 30 formed thereon in a boundary between the individual module mounting regions (A of FIG. 5H) using a blade 71.

In the electronic component module according to exemplary embodiments of the present disclosure manufactured in the above-described operations, the lead frame 120 is mounted together with the electronic components 1 (particularly, the electronic components mounted on the lower surface of the substrate), rather than mounting the electronic components 1 after the substrate 10 and the lead frame 120 are bonded to each other. That is, after the electronic components 1 together with the lead frame 120 are seated on the lower surface of the substrate 10, they are fixed and bonded to one another in the curing process.

Therefore, the number of operations in the manufacturing process may be decreased as compared to a method in which the electronic components and the lead frame are bonded to the substrate separately, thereby easing the manufacturing process.

As set forth above, according to exemplary embodiments of the present disclosure, since the plurality of electronic components may be mounted on both surfaces of the substrate, the degree of integration may be increased. In addition, since the external connection terminals of the substrate on which the electronic components are mounted are formed using the connection conductors, the external connection terminals may be easily formed.

In addition, the manufacturing method according to an exemplary embodiment of the present disclosure may form a path connecting the substrate and the external connection terminals to each other by using the lead frame. Therefore, the formation of the external connection terminals in the double-sided mounting type electronic component module may be easily implemented.

In addition, the connection conductors may be formed by mounting the lead frame on the substrate and then removing the connectors of the lead frame. In addition, the blocking members may be formed on the connection conductors by using only the process of removing portions of the connectors of the lead frame.

Therefore, since the connection conductors may be collectively mounted on the substrate, the manufacturing process may be easily implemented. In addition, since the connection conductors may be firmly bonded to the substrate, reliability of the connection conductors may be secured.

While exemplary embodiments have been shown and described above, it will be apparent to those skilled in the art that modifications and variations could be made without departing from the spirit and scope of the present disclosure as defined by the appended claims.

What is claimed is:

1. An electronic component module, comprising:
a substrate;
a plurality of electronic components mounted on both surfaces of the substrate;
connection conductors each having one end bonded to one surface of the substrate using a conductive adhesive and formed as a metal post; and
a molded portion having the connection conductor embedded therein and formed on one surface of the substrate,
wherein the connection conductor has at least one blocking member preventing a spread of the conductive adhesive,
wherein the blocking member protrudes from a portion of the connection conductor adjacent to one end of the connection conductor in an outer diameter direction thereof such that the blocking member is disposed between the center of the connection conductor and one end of the connection conductor,
wherein the blocking member is spaced apart from one end of the connection conductor bonded to the substrate, and
wherein the conductive adhesive is disposed between the blocking member and the substrate.

2. The electronic component module of claim 1, wherein the spread of the conductive adhesive in a vertical direction and a horizontal direction is blocked by the blocking member.

3. The electronic component module of claim 2, wherein an edge of the blocking member is chamfered to form a chamfered surface.

4. The electronic component module of claim 3, wherein the conductive adhesive is formed to have a size corresponding to a range having a protruded length of the blocking member as a radius.

5. The electronic component module of claim 1, wherein at least two of the connection conductors disposed to be adjacent to each other have respective blocking members disposed opposite to each other.

6. The electronic component module of claim 1, further comprising a plurality of external connection terminals bonded to the connection conductors.

* * * * *